(12) United States Patent
Zhang et al.

(10) Patent No.: US 9,564,338 B1
(45) Date of Patent: Feb. 7, 2017

(54) SILICON-SELECTIVE REMOVAL

(71) Applicant: Applied Materials, Inc., Santa Clara, CA (US)

(72) Inventors: Jingchun Zhang, Milpitas, CA (US); Hanshen Zhang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/847,496

(22) Filed: Sep. 8, 2015

(51) Int. Cl.
*H01L 21/302* (2006.01)
*H01L 21/3065* (2006.01)
*H01L 21/3213* (2006.01)

(52) U.S. Cl.
CPC ..... *H01L 21/3065* (2013.01); *H01L 21/32137* (2013.01)

(58) Field of Classification Search
CPC ........... H01L 21/3065; H01L 21/32137; H01L 21/32357; C23F 1/12; C23F 1/02; H01J 37/3244; H01J 2237/3341
USPC ...... 216/58, 67, 79; 438/706, 710, 719, 724, 438/730
See application file for complete search history.

(56) References Cited

U.S. PATENT DOCUMENTS

| 8,808,563 B2 | 8/2014 | Wang et al. |
| 2013/0089988 A1* | 4/2013 | Wang ................ H01J 37/32357 438/719 |
| 2015/0126040 A1* | 5/2015 | Korolik ............... H01L 21/3065 438/718 |

* cited by examiner

*Primary Examiner* — Duy Deo
*Assistant Examiner* — Maki Angadi
(74) *Attorney, Agent, or Firm* — Patterson & Sheridan, LLP (57) ABSTRACT

A method of etching exposed silicon on patterned heterogeneous structures is described and includes a gas phase etch using plasma effluents formed in a remote plasma. The remote plasma excites a fluorine-containing precursor. Plasma effluents within the remote plasma are flowed into a substrate processing region where the plasma effluents combine with a hydrogen-containing precursor. The combination reacts with the patterned heterogeneous structures to remove an exposed silicon portion faster than a second exposed portion. The silicon selectivity results from the presence of an ion suppressor positioned between the remote plasma and the substrate processing region. The methods may be used to selectively remove silicon faster than silicon oxide, silicon nitride and a variety of metal-containing materials. The methods may be used to remove small etch amounts in a controlled manner and may result in an extremely smooth silicon surface.

20 Claims, 6 Drawing Sheets

SILICON-SELECTIVE REMOVAL

BACKGROUND

Field

Embodiments described herein relate to selectively etching silicon.

Description of Related Art

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process which etches one material faster than another, for example, to improve pattern transfer process proceed. Such an etch process is generally said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be quickly stopped by removing the gas phase reagents. Some dry-etch processes involve the exposure of a substrate to remote plasma by-products formed from one or more precursors. For example, remote plasma generation of nitrogen trifluoride in combination with ion suppression techniques enable silicon to be selectively removed from a patterned substrate when the plasma effluents are flowed into the substrate processing region. However, the silicon selectivity occasionally needs to be even higher for certain applications.

Thus, methods are needed to increase silicon selectivity relative to silicon oxide, silicon nitride and other materials for dry etch processes.

SUMMARY

In one embodiment, a method of etching a substrate is provided. The method includes positioning a substrate in a processing chamber. The substrate may have a first exposed portion which includes silicon and a second exposed portion which includes at least one material other than silicon. A fluorine-containing precursor may be introduced into a remote plasma region of the processing chamber and RF power may be applied to generate plasma effluents in the remote plasma region. A hydrogen-containing precursor may be introduced into a substrate processing region through first showerhead channels bypassing the remote plasma region and the plasma effluents from the remote plasma region may be flowed through second showerhead channels to the substrate processing region of the processing chamber. The atomic flow ratio of hydrogen to fluorine may be between about 4:3 and about 10:1 and the plasma effluents may etch the first exposed portion at a rate greater than an etch rate of the second exposed portion.

In another embodiment, a method of etching a substrate is provided. The method includes positioning a substrate in a processing chamber. The substrate may have an exposed polysilicon portion and an exposed silicon nitride portion. A fluorine-containing precursor may be introduced into a remote plasma region of the processing chamber and RF power may be applied to generate plasma effluents in the remote plasma region. A hydrogen-containing precursor may be introduced into a substrate processing region through first showerhead channels bypassing the remote plasma region and the plasma effluents from the remote plasma region may be flowed through second showerhead channels to the substrate processing region of the processing chamber. The atomic flow ratio of hydrogen to fluorine may be between about 4:3 and about 10:1 and the plasma effluents may etch the exposed polysilicon portion at a rate greater than an etch rate of the exposed silicon nitride portion.

In yet another embodiment, a method of etching a substrate is provided. The method includes positioning a substrate in a processing chamber. The substrate may have an exposed polysilicon portion and an exposed silicon oxide portion. A fluorine-containing precursor may be introduced into a remote plasma region of the processing chamber and RF power may be applied to generate plasma effluents in the remote plasma region. A hydrogen-containing precursor may be introduced into a substrate processing region through first showerhead channels bypassing the remote plasma region and the plasma effluents from the remote plasma region may be flowed through second showerhead channels to the substrate processing region of the processing chamber. The atomic flow ratio of hydrogen to fluorine may be between about 4:3 and about 10:1 and the plasma effluents may etch the exposed polysilicon portion at a rate greater than an etch rate of the exposed silicon oxide portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method of etching exposed silicon on patterned heterogeneous structures is described and includes a gas phase etch using plasma effluents formed in a remote plasma. The remote plasma excites a fluorine-containing precursor. Plasma effluents within the remote plasma are flowed into a substrate processing region where the plasma effluents combine with a hydrogen-containing precursor. The combination reacts with the patterned heterogeneous structures to remove an exposed silicon portion faster than a second exposed portion. The silicon selectivity results from the presence of an ion suppressor positioned between the remote plasma and the substrate processing region. The methods may be used to selectively remove silicon faster than silicon oxide, silicon nitride and a variety of metal-containing materials. The methods may be used to remove small etch amounts in a controlled manner and may result in a suitably smooth silicon surface.

Silicon portions are selectively removed in comparison, for example, to silicon oxide portions or silicon nitride portions when the hydrogen-containing precursor is not excited in any plasma prior to entering the substrate processing region. The fluorine-containing precursor is predominantly excited in the remote plasma to form plasma effluents comprising a radical-fluorine precursor. Without binding the coverage of the claims to hypothetical mechanisms, it is believed that the preponderance of unexcited hydrogen-containing precursor (e.g. $H_2$) maintains a stable hydrogen termination on a broad array of exposed materials. The exposure to the unexcited hydrogen-containing precursor also hydrogen terminates silicon surfaces, however, the fluorine radicals are able to break the Si—H bonds to form Si—F bonds until volatile Si—F species desorb from the surface and are evacuated from the substrate processing region. The open bonding sites (left behind by the desorption event) are quickly hydrogen terminated and the process continues, especially when the hydrogen-containing precursor is more plentiful than the radical-fluorine in the substrate processing region.

Figure 1:
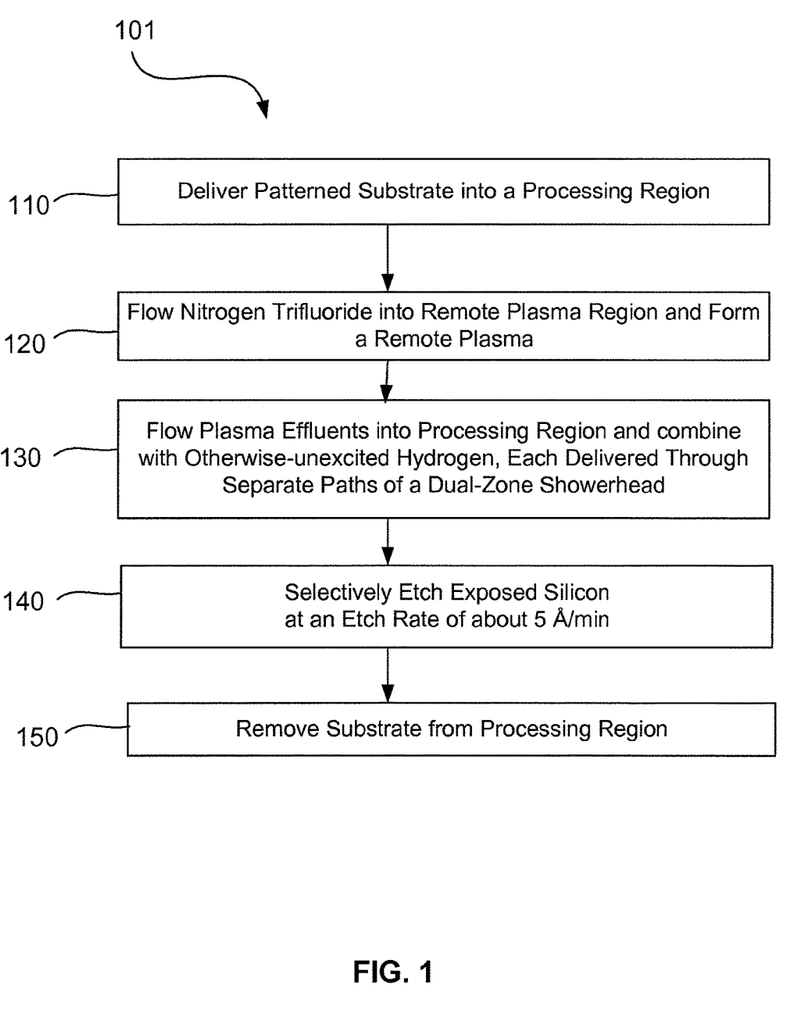
FIG. 1 is a flow chart of a silicon-selective etch process according to embodiments described herein.

FIG. 1 illustrates a flow chart of a silicon-selective etch process 101 according to embodiments. Prior to the first operation, the substrate is patterned and an exposed silicon portion is formed on the patterned substrate. An exposed silicon nitride portion is also formed on the patterned substrate. The patterned substrate is then placed within the substrate processing region in operation 110.

Nitrogen trifluoride is flowed into a remote plasma region in operation 120. The nitrogen trifluoride is excited in a remote plasma formed in the remote plasma region (also in operation 120). The remote plasma system is positioned next to the substrate processing region and fluidly coupled through a dual-channel showerhead. A substrate processing chamber may house both the remote plasma region and the substrate processing region. The plasma effluents formed in the remote plasma are flowed through the dual-channel showerhead into the substrate processing region in operation 130. A hydrogen-containing precursor (e.g. $H_2$) may also be simultaneously flowed into the substrate processing region and combined with the plasma effluents in operation 130. The hydrogen-containing precursor is not passed through the remote plasma region and therefore may be excited by interaction with the plasma effluents according to embodiments. The hydrogen-containing precursor is not passed through any remote plasma region before entering the substrate processing region in certain embodiments. The hydrogen-containing precursor may be introduced through separate pores in a dual-channel showerhead into the substrate processing region without prior plasma excitation. Generally, the hydrogen-containing precursor may include at least one precursor selected from the group consisting of $H_2$, $NH_3$ and hydrocarbons. Other sources of fluorine may be used to augment or replace the nitrogen trifluoride. In general, a fluorine-containing precursor is flowed into the remote plasma region and the fluorine-containing precursor comprises at least one precursor selected from the group consisting of atomic fluorine, diatomic fluorine, nitrogen trifluoride, carbon tetrafluoride, hydrogen fluoride and xenon difluoride.

In operation 140, the patterned substrate may be selectively etched such that the exposed silicon oxide is removed at a very slow rate, for example, about 5 Å/min, but still at a higher rate than the exposed silicon nitride. In operation 150, the reactive chemical species are removed and the patterned substrate is removed from the substrate processing region. With the decreasing size of integrated circuits, there is a need to remove ever smaller thicknesses to subtly recess a variety of features. A benefit of the low etch rate described herein is that small amounts of silicon may be reproducibly removed. A further benefit of the low etch rate methods described herein has been found to include a smoother interface which also positively impacts the performance of integrated circuits.

Figure 2:
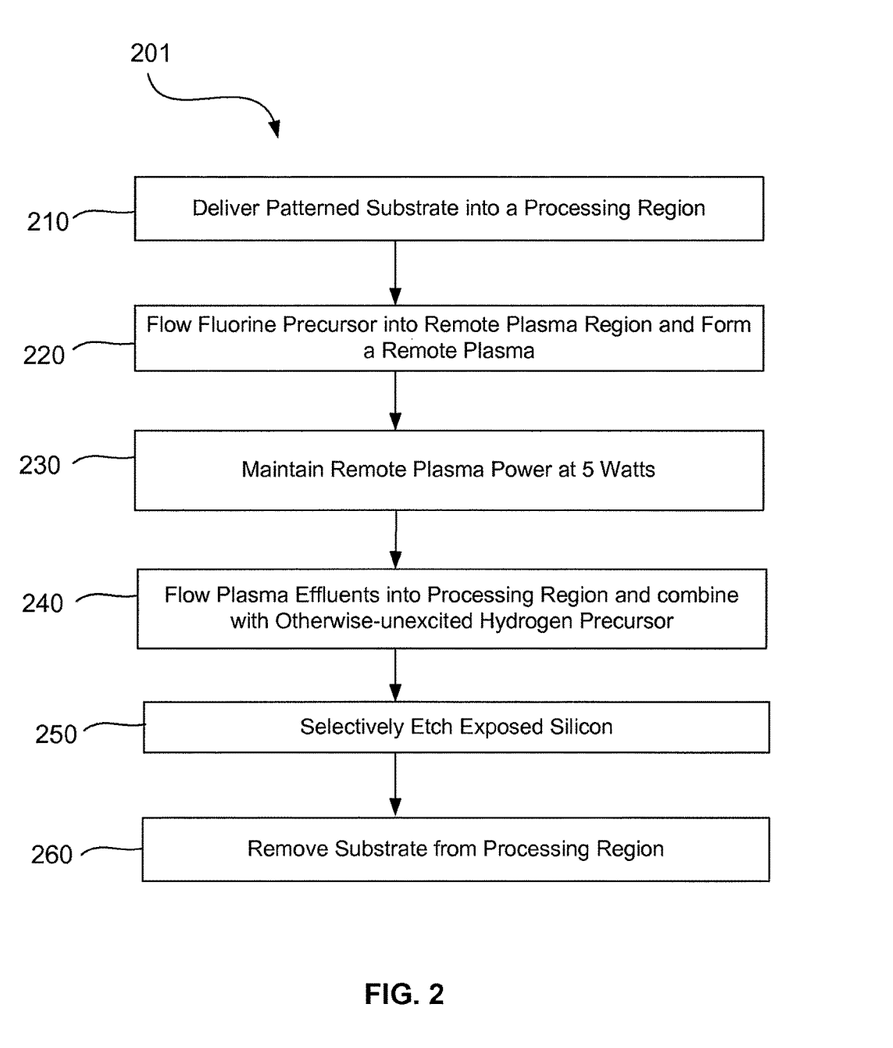
FIG. 2 is a flow chart of a silicon-selective etch process according to embodiments described herein.

FIG. 2 illustrates a flow chart of a silicon-selective etch process 201 according to embodiments described herein. The substrate is patterned and an exposed silicon portion and an exposed silicon oxide portion are formed on the patterned substrate. In operation 210, the patterned substrate is then placed within the substrate processing region. A fluorine-containing precursor (e.g. $NF_3$) is flowed into a remote plasma region in operation 220. Also in operation 220, the fluorine-containing precursor may be excited in a remote plasma formed in the remote plasma region. In operation 230, the remote plasma is formed by capacitively applying about 5 watts of RF power between two parallel plates adjacent the remote plasma region. The plasma effluents formed in the remote plasma are then flowed through the dual-channel showerhead into the substrate processing region in operation 240. In addition, a hydrogen-containing precursor (e.g. $H_2$) is simultaneously flowed into the substrate processing region and combined with the plasma effluents in operation 240. The patterned substrate is selectively etched in operation 250 such that the exposed silicon oxide is selectively removed at a very slow rate but still at a much higher rate than the exposed silicon oxide. In operation 260, the reactive chemical species are removed and the patterned substrate is removed from the substrate processing region.

The etch processes and process parameters described herein may be used to smoothly remove silicon at a slow and controlled rate which is increasingly useful for semiconductor front-end processes. The etch process may remove silicon at an etch rate less than about 100 Å/min, less than about 50 Å/min, less than about 25 Å/min, or even less than about 15 Å/min in embodiments. The selectivity, the non-local plasma, the controlled ionic concentration, and the lack of solid byproducts, each make the etch processes described herein well suited for delicately removing or trimming silicon structures removing little or secondary materials. According to embodiments, the etch amount of silicon removed in by silicon-selective etch process 101 may be between about 5 Å and about 30 Å, between about 6 Å and about 25 Å, or between about 7 Å and about 20 Å.

The methods presented herein exhibit high etch selectivity of the exposed silicon portion relative to an exposed silicon nitride and/or silicon oxide portions. Generally, embodiments described herein are made with reference to processing of a 300 mm substrate, however, it is contemplated that substrates having various other dimensions may be processed with suitably configured processing parameters adapted to compensate for volumetric and areal differences.

The flow of the fluorine-containing precursor may be accompanied by a flow of a relatively inert gas, such as one or more of He, $N_2$, and Ar. The flow of the hydrogen-containing precursor may also be independently accompanied by a flow of a relatively inert gas as well according to embodiments. Generally speaking, inert gases can be used to provide a steadier flow rate of reactive precursor, to improve plasma stability, and/or to carry liquid precursors to the remote plasma region and/or the substrate processing region as appropriate. Flow rates and ratios of the precursors may be used to control etch rates and etch selectivity. In an embodiment, the fluorine-containing gas includes $NF_3$ at a flow rate of between about 1 sccm (standard cubic centimeters per minute) and about 600 sccm, $H_2$ at a flow rate of between about 2 sccm and about 5,000 sccm, He at a flow rate of between about 0 sccm and about 3000 sccm, and Ar at a flow rate of between about 0 sccm and about 3000 sccm. It is contemplated that other gases and/or flows may be used depending on a number of factors including processing chamber configuration, substrate size, geometry and layout of features being etched.

The flow rate of the fluorine-containing gas may be between about 100 sccm and about 300 sccm according to embodiments. The flow rate of the hydrogen-containing gas may be greater than about 200 sccm, greater than about 500 sccm, greater than about 1000 sccm or greater than about 2500 sccm in embodiments. Increasing the flow rate of the inert gas also desirably lowers the silicon etch rate, increasing control for small etch amounts. The flow rate of the inert gas (e.g. argon) may be greater than about 1,000 sccm, greater than about 2,000 sccm, greater than about 4,000 sccm, or greater than about 10,000 sccm according to embodiments.

The flow rate of the nitrogen trifluoride relative to the flow rate of the hydrogen may be configured to effect a relatively low atomic flow ratio of H:F in embodiments. Thus, lesser amounts of precursor may be utilized while maintaining suitable etch selectivity which may result in a more efficient etch process. The atomic flow ratio of hydrogen (H) to fluorine (F) may be used to assist in achieving suitably high etch selectivity of silicon, according to embodiments, to attain the high etch selectivities reported herein. The atomic flow ratio of H:F may be greater than about 4:3, greater than about 4:1, or greater than 14:1 in embodiments. Alternatively, the atomic flow ratio of H:F may be less than about 25:1, less than about 10:1, less than about 5:1, for example, about 4:3. In one embodiment, the atomic flow ratio of H:F may be between about 4:3 and less than about 10:1. While higher H:F atomic flow ratios may increase the silicon selectivity in certain embodiments, it has been found that H:F ratios of greater than about 1:1, such as about 4:3, may provide suitable etch selectivity for various etching applications. For example, it has been found that a H:F ratio of 4:3 may provide a Si:SiN etch selectivity greater than about 600:1 in certain embodiments. Some precursors may contain both fluorine and hydrogen, in which case the atomic flow rate of all contributions are included when calculating the atomic flow ratio described herein. The atomic flow ratio Ar:F (or another inert gas) may be greater than about 1:1, greater than about 100:1, or greater than about 1000:1 in embodiments.

The methods presented herein exhibit high etch selectivity of the exposed silicon portion relative to an exposed silicon nitride and/or silicon oxide portions. Generally, embodiments described herein are made with reference to processing of a 300 mm substrate, however, it is contemplated that substrates having various other dimensions may be processed with suitably configured processing parameters adapted to compensate for volumetric and areal differences. The etch selectivity (silicon:silicon oxide) may be greater than about 100:1, greater than about 150:1, greater than about 200:1, or greater than about 250:1 in embodiments. The etch selectivity (silicon:silicon oxide or silicon:silicon nitride) may be greater than about 100:1, greater than about 150:1, greater than about 200:1, greater than about 250:1, or greater than about 300:1 in embodiments.

Without limitation to hypothetical mechanisms, it is believed the preponderance of hydrogen may hydrogen terminate exposed surfaces on the patterned substrate. Hydrogen termination may be metastable on the exposed silicon portions. Fluorine from the nitrogen trifluoride or other fluorine-containing precursors may be displacing the hydrogen on the silicon surface and create a volatile residue which leaves the surface and carries away silicon. Due to the strong bond energies present in the other exposed materials, the fluorine may be unable to displace the hydrogen of the other hydrogen terminated surfaces (and/or may be unable to create volatile residue to remove the other exposed material), resulting in improved etch selectivity.

Generally speaking, the methods presented herein may be used to selectively etch silicon oxide relative to a wide variety of materials and not just silicon nitride. The methods may be used to selectively etch exposed silicon oxide faster than polysilicon, titanium, titanium nitride, titanium oxide, titanium silicide, hafnium, hafnium oxide, hafnium silicide, tantalum, tantalum oxide, tantalum nitride, tantalum silicide, cobalt, cobalt oxide, cobalt silicide, tungsten, tungsten oxide, tungsten silicide, silicon carbide, silicon nitride, silicon oxynitride, silicon carbon nitride, C—H films, C—H—N films, silicon germanium, germanium, nickel, nickel oxide or nickel silicide. The first etch rate may be used to describe the etch rate of the exposed silicon portion and the second etch rate may be used to describe the etch rate of the second exposed portion of the alternative material. The first etch rate may exceed the second etch rate by a factor of greater than about 80, greater than about 120 or greater than about 150 in embodiments. The second exposed portion may have a compositional atomic ratio other than 1:2 (Si:O) which includes all the exemplary alternative materials listed above and further specified below. In one example, metal-containing portions may also be present on the patterned substrate, such as the aforementioned tantalum cobalt, tungsten, hafnium, or titanium-containing examples. The etch rate ratio (the etch selectivity silicon:exposed metal-containing portion) may be greater than about 100:1, greater than about 150:1, greater than about 200:1, greater than about 250:1, greater than about 500:1, greater than about 1000:1, greater than about 2000:1 or greater than about 3000:1 in embodiments.

The high etch selectivities described herein may be assisted by making the hydrogen-containing precursor devoid or essentially devoid of oxygen. Similarly, the remote plasma region and the substrate processing region may be described as oxygen-free or devoid of oxygen, in embodiments, during silicon-selective etch process 101, silicon-selective etch process 201, operation 140, and/or operation 250. The fluorine-containing precursor may be devoid or essentially devoid of oxygen, as well, according to embodiments.

The second exposed portion may include at least one element from the group consisting of nitrogen, hafnium, titanium, cobalt, carbon, tantalum, tungsten, and germanium according to embodiments. The second exposed portion may consist essentially of or consist of a composition selected from the group of silicon, tantalum, tantalum and oxygen, tantalum and silicon, tantalum and nitrogen, cobalt, cobalt and oxygen, cobalt and silicon, tungsten, tungsten and oxygen, tungsten and silicon, nickel, nickel and oxygen, nickel and silicon, silicon and nitrogen, silicon and oxygen and nitrogen, silicon and carbon and nitrogen, silicon and carbon, carbon, carbon and hydrogen, carbon and hydrogen and nitrogen, silicon and germanium, germanium, hafnium, hafnium and oxygen, hafnium and silicon, titanium, titanium and oxygen, titanium and nitrogen, or titanium and silicon in embodiments.

The pressure in the substrate processing region and the remote plasma region(s) during the etching operations may be between about 0.01 Torr and about 50 Torr, between about 0.1 Torr and about 15 Torr or between about 0.2 Torr and about 10 Torr in embodiments. The temperature of the patterned substrate during the etching operations may be between about −40° C. and about 250° C., between about −30° C. and about 150° C. or between about −20° C. and about 50° C. in embodiments. Lower patterned substrate temperatures generally correlate with a smoother post-etch surface. The temperature of the patterned substrate during the etching operations may be between about 100° C. and about 400° C., between about 150° C. and about 350° C., or between about 200° C. and about 300° C. in embodiments. Higher patterned substrate temperatures generally correlate with a reduced etch rate and greater control of etch amount.

The silicon-selective etch process 101 also includes applying power to the fluorine-containing precursor during operations 120 and 220 in the remote plasma regions to generate the plasma effluents. The plasma parameters described herein apply to remote plasmas used to etch the patterned substrate. As would be appreciated by one of ordinary skill in the art, the plasma may include a number of charged and neutral species including radicals and ions. The plasma may be generated using known techniques (e.g., RF, capacitively coupled, inductively coupled). In an embodiment, the remote plasma power may be applied to the remote plasma region at a level between about 500 W and about 10 kW for a remote plasma external to the substrate processing chamber. The remote plasma power may be applied using inductive coils, in embodiments, in which case the remote plasma will be referred to as an inductively-coupled plasma (ICP) or may be applied using capacitive plates, in which case the remote plasma will be referred to as a capacitive-coupled plasma (CCP). According to embodiments, the remote plasma power may be applied to the remote plasma region at a level between about 3 watts and about 2000 watts, between about 5 watts and about 500 watts or between about 5 watts and about 150 watts for a remote plasma within the substrate processing chamber. Other possible plasma parameters and ranges will be described along with exemplary equipment herein.

For both treatment remote plasmas and etch remote plasmas, the flows of the precursors into the remote plasma region may further include one or more relatively inert gases, such as He, $N_2$, or Ar. The inert gas can be used to improve plasma stability, ease plasma initiation, and improve process uniformity. Argon may be helpful, as an additive, to promote the formation of a stable plasma. Process uniformity is generally increased when helium is included. The inert gas additives are present in embodiments throughout this specification regardless of whether the accompanying precursor is flowed through a remote plasma or directly into the substrate processing region. Flow rates and ratios of the precursors may be used to control etch rates and etch selectivity.

In certain embodiments, an ion suppressor (which may be the showerhead) may be used to provide radical and/or neutral species for gas-phase etching. The ion suppressor may also be referred to as an ion suppression element. For example, the ion suppressor is used to filter etching plasma effluents en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are one exemplary way to achieve a low electron temperature in the substrate processing region during the gas-phase etch processes described herein.

In certain embodiments, an electron beam is passed through the substrate processing region in a plane parallel to the substrate to reduce the electron temperature of the plasma effluents. A more basic showerhead design may be used if an electron beam is applied in this manner. The electron beam may be passed as a laminar sheet disposed above the substrate in these embodiments. The electron beam provides a source of neutralizing negative charge and provides a reduced flow of positively charged ions towards the substrate. The electron beam may also increase the etch selectivity in certain embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. In one embodiment, the electron temperature may be less than about 0.5 eV, less than about 0.45 eV, less than about 0.4 eV, or less than about 0.35 eV during the etching operations. The aforementioned relatively low values for the electron temperature are enabled by the presence of the electron beam, showerhead, and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments described herein are also advantageous over conventional wet etch processes where surface tension of liquids can cause bending and peeling of small features. Alternatively, the electron temperature during the selective etch process may be greater than about 0.5 eV, greater than about 0.6 eV, or greater than about 0.7 eV according to embodiments.

The substrate processing region may be described herein as "plasma-free" during the etch processes described herein. "Plasma-free" does not necessarily mean the region is entirely devoid of plasma. Ionized species and free electrons created within the plasma region may travel through pores (apertures) in the partition (showerhead) at exceedingly small concentrations. It is possible that borders of the plasma in the chamber plasma region may encroach to some small degree upon the substrate processing region through the apertures in the showerhead. Furthermore, a low intensity plasma may be created in the substrate processing region without eliminating desirable features of the etch processes described herein. It is contemplated that all causes for a plasma having a much lower intensity ion density than the chamber plasma region during the creation of the excited plasma effluents do not deviate from the scope of "plasma-free" as used herein.

Figure 3A:
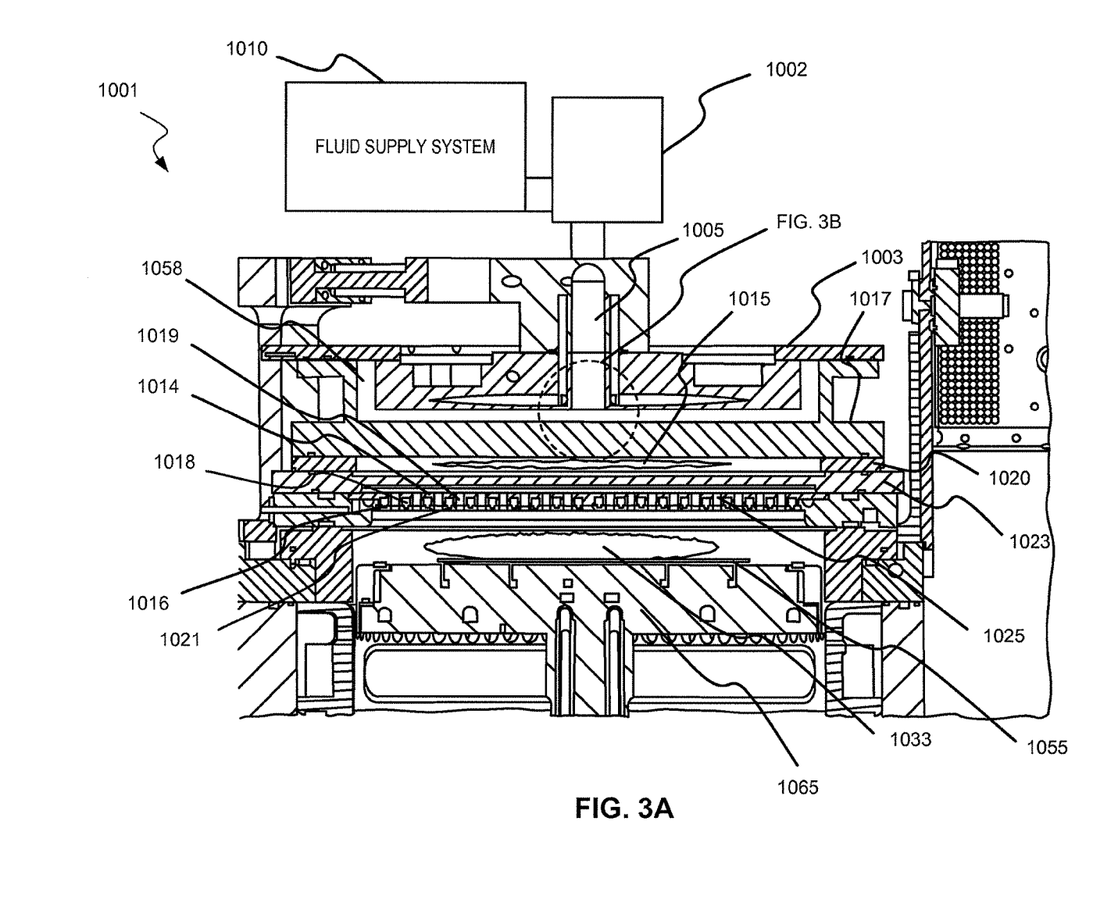
FIG. 3A shows a schematic cross-sectional view of a substrate processing chamber according to embodiments described herein.

FIG. 3A illustrates a cross-sectional view of an exemplary substrate processing chamber 1001 with a partitioned plasma generation region within the processing chamber. During film etching, a process gas may be flowed into chamber plasma region 1015 through a gas inlet assembly 1005. A remote plasma system (RPS) 1002 may optionally be included in the system and may process a first gas which then travels through gas inlet assembly 1005. The process gas may be excited within the RPS 1002 prior to entering a chamber plasma region 1015. Accordingly, the fluorine-containing precursor as discussed above, for example, may pass through the RPS 1002 or bypass the RPS 1002 in certain embodiments.

A cooling plate 1003, faceplate 1017, ion suppressor 1023, showerhead 1025, and a pedestal 1065, having a substrate 1055 disposed thereon, are shown and may each be included in various embodiments. The pedestal 1065 may have a heat exchange channel through which a heat exchange fluid flows to control the temperature of the substrate. The aforementioned configuration may allow the substrate 1055 temperature to be cooled or heated to maintain relatively low temperatures, such as between −40° C. to 200° C. The pedestal 1065 may also be resistively heated to relatively high temperatures, such as between about 100° C. and about 1100° C., using an embedded heater element.

Exemplary configurations may include having the gas inlet assembly 1005 open into a gas supply region 1058 partitioned from the chamber plasma region 1015 by the faceplate 1017 so that the gases/species flow through the holes in the faceplate 1017 into the chamber plasma region 1015. Structural and operational features may be selected to prevent significant backflow of plasma from the chamber plasma region 1015 back into the gas supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and the showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the chamber plasma region.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional control of the flow of ionic species through the suppressor. The ion suppressor 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the embodiments described herein, the plasma may be provided by RF power delivered to the faceplate 1017 relative to the ion suppressor 1023 and/or the showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than about 1 GHz in embodiments. The plasma power may be capacitively-coupled (CCP) or inductively-coupled (ICP) into the remote plasma region.

A precursor, for example, a fluorine-containing precursor, may be flowed into the substrate processing region 1033 by various showerhead embodiments described herein. Excited species derived from the process gas in the chamber plasma region 1015 may travel through apertures in the ion suppressor 1023, and/or showerhead 1025 and react with a hydrogen-containing precursor flowing into the substrate processing region 1033 from a separate portion of the showerhead. Accordingly, the showerhead 1025 may be referred to as a dual-channel showerhead. Little or no plasma may be present in the substrate processing region 1033 during the remote plasma etch process. Excited derivatives of the precursors may combine in the region above the substrate and/or on the substrate to etch structures or remove species from the substrate.

The processing gases may be excited in chamber plasma region 1015 and may be passed through the showerhead 1025 to substrate processing region 1033 in the excited state. A plasma may be generated in the substrate processing region 1033 in certain embodiments. Alternatively, the plasma may not be generated in the substrate processing region 1033. In one example, the only excitation of the processing gas or precursors may be from exciting the processing gases in chamber plasma region 1015 to react with one another in substrate processing region 1033. As previously discussed, the location of plasma generation may be to protect the structures patterned on substrate 1055.

Figure 3B:
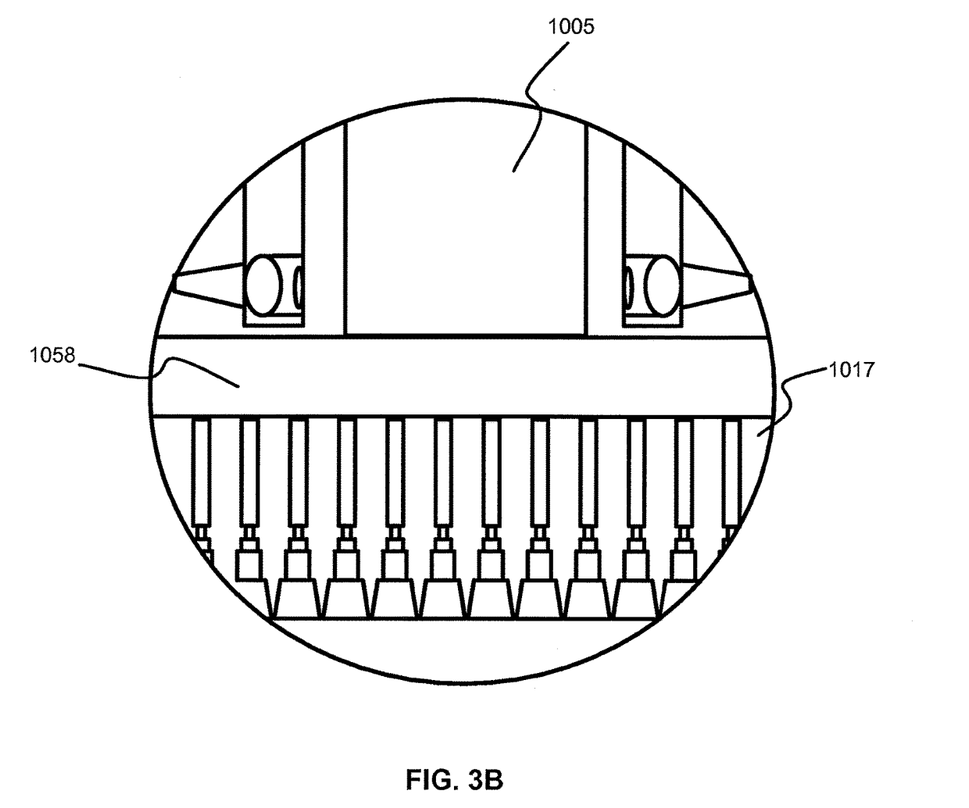
FIG. 3B shows a schematic cross-sectional view of a portion of a substrate processing chamber according to embodiments described herein.

FIG. 3B shows a detailed view of the features affecting the processing gas distribution through faceplate 1017. The gas distribution assemblies, such as showerhead 1025, for use in the processing chamber section 1001 may be referred to as dual-channel showerheads (DCSH) and are additionally detailed in the embodiments described in FIG. 3A as well as FIG. 3C herein. The dual channel showerhead may provide for etching processes that allow for separation of etchants outside of the substrate processing region 1033 to provide limited interaction with chamber components and each other prior to being delivered into the substrate processing region 1033.

The showerhead 1025 may comprise an upper plate 1014 and a lower plate 1016. The plates 1014, 1016 may be coupled with one another to define a volume 1018 therebetween. The coupling of the plates 1014, 1016 may be so as to provide first fluid channels 1019 through the upper plate 1014 and the lower plate 1016, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the showerhead 1025. Although the system described with regard to FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

In the illustrated embodiment, the showerhead 1025 may distribute, via first fluid channels 1019, process gases which contain plasma effluents upon excitation by a plasma in the chamber plasma region 1015. In embodiments, the process gas introduced into RPS 1002 and/or chamber plasma region 1015 may contain fluorine, e.g., $NF_3$. The process gas may also include a carrier gas such as helium, argon, nitrogen ($N_2$) etc. Plasma effluents may include ionized or neutral derivatives of the process gas and may also be referred to herein as a radical-fluorine precursor referring to the atomic constituent of the process gas introduced.

Figure 3C:
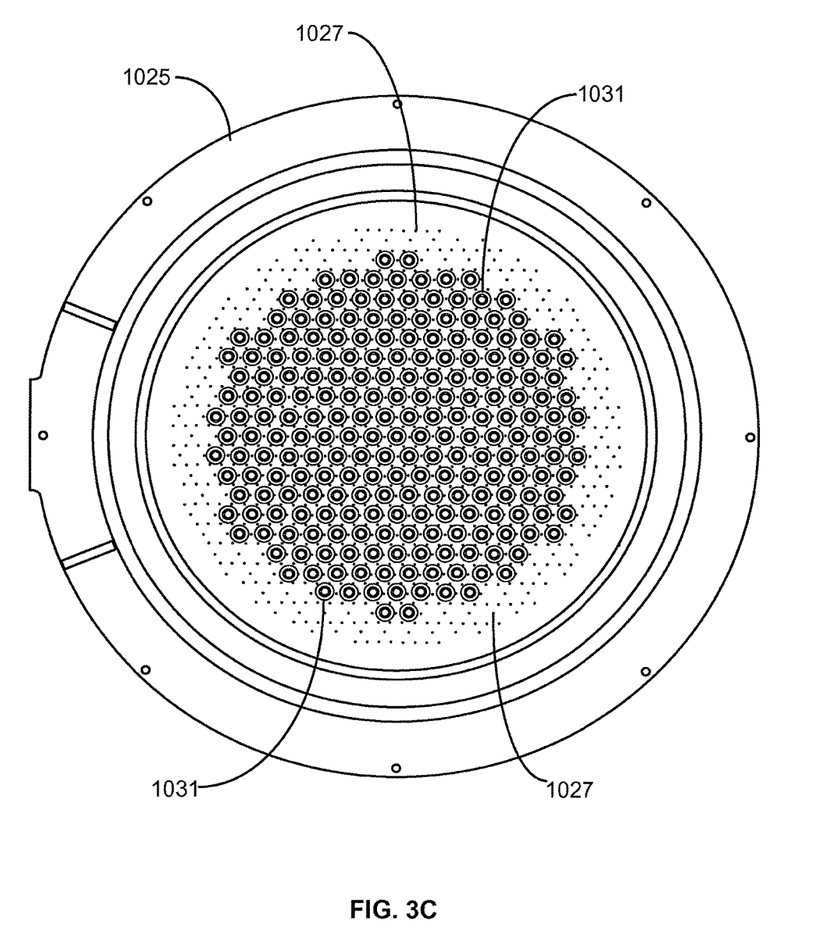
FIG. 3C shows a bottom view of a showerhead according to embodiments described herein.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead 1025, even amongst the through-holes 1031, which may help to provide more even mixing of the precursors as they exit the showerhead 1025 than other configurations.

The chamber plasma region 1015 or a region in an RPS may be referred to as a remote plasma region. In embodiments, the radical-fluorine precursor is created in the remote plasma region and travel into the substrate processing region to combine with the hydrogen-containing precursor. In embodiments, the hydrogen-containing precursor is excited by the radical-fluorine precursor. Plasma power may be predominantly applied to the remote plasma region in embodiments to ensure that the radical-fluorine precursor provides the dominant excitation.

Figure 4:
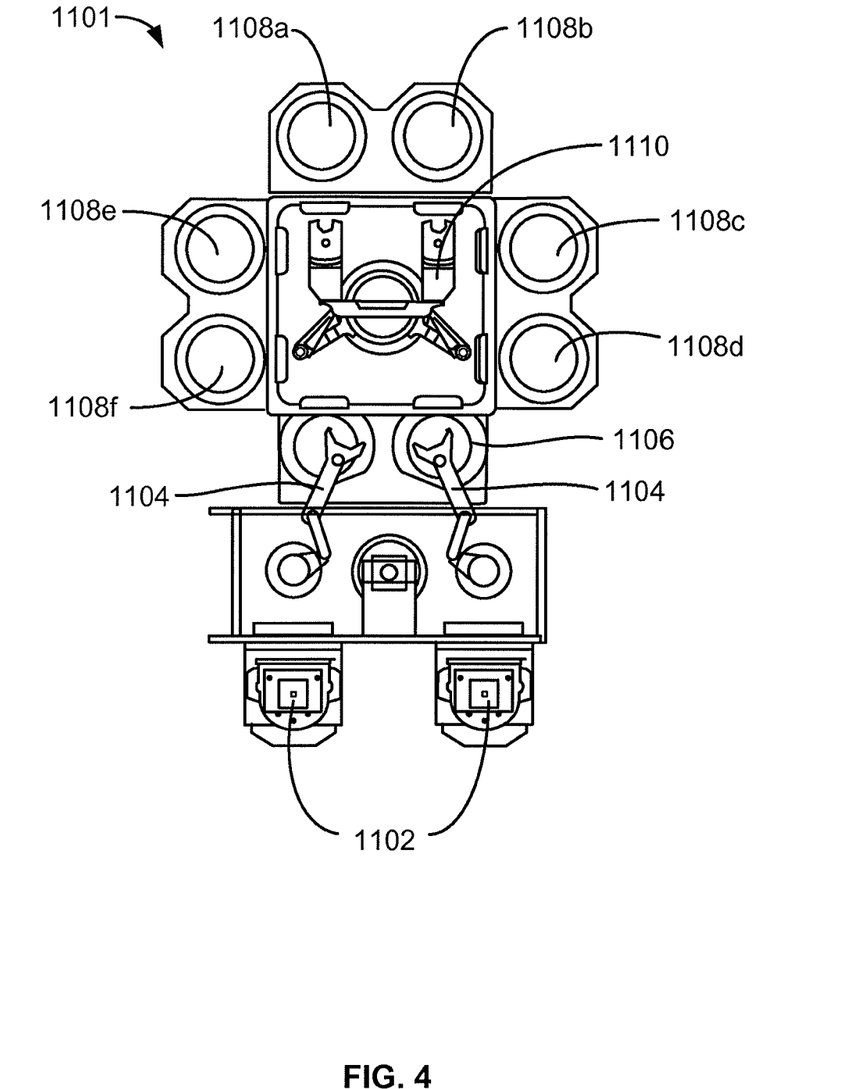
FIG. 4 shows a top view of an exemplary substrate processing system according to embodiments described herein.

Embodiments of the dry etch systems may be incorporated into larger fabrication systems for producing integrated circuit chips. FIG. 4 shows one such processing system (mainframe) 1101 of deposition, etching, baking, and curing chambers in embodiments. As illustrated, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrates from the holding area 1106 to the substrate processing chambers 1108a-f and back. Each substrate processing chamber 1108a-f can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

As described above, the showerhead may be referred to as a dual-channel showerhead as a result of the two distinct pathways into the substrate processing region. The fluorine-containing precursor may be flowed through the through-holes in the dual-channel showerhead and the hydrogen-containing precursor may pass through separate channels in the dual-channel showerhead. The separate channels may open into the substrate processing region but not into the remote plasma region as described above.

Combined flow rates of plasma effluents and other precursors into the substrate processing region may account for 0.05% to 20% by volume of the overall gas mixture; the remainder being carrier gases. The fluorine-containing precursor is flowed into the remote plasma region but the plasma effluents may have the same volumetric flow ratio, in embodiments. In the case of the fluorine-containing precursor, a purge or carrier gas may be first initiated into the remote plasma region before the fluorine-containing gas to stabilize the pressure within the remote plasma region.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly silicon but may include concentrations of other elemental constituents such as e.g., nitrogen, oxygen, hydrogen and carbon. In some embodiments, silicon portions etched using the methods described herein consist essentially of silicon. Exposed "silicon oxide" of the patterned substrate is predominantly $SiO_2$ but may include concentrations of other elemental constituents such as, e.g., nitrogen, hydrogen and carbon. In some embodiments, silicon oxide portions described herein consist essentially of silicon and oxygen. Exposed "silicon nitride" of the patterned substrate is predominantly $Si_3N_4$ but may include concentrations of other elemental constituents, such as, e.g., oxygen, hydrogen and carbon. In some embodiments, silicon nitride portions described herein consist essentially of silicon and nitrogen. Exposed "hafnium oxide" of the patterned substrate is predominantly hafnium and oxygen but may include small concentrations of elements other than hafnium and oxygen. In some embodiments, hafnium oxide portions described herein consist essentially of hafnium and oxygen. Exposed "tungsten" of the patterned substrate is predominantly tungsten but may include small concentrations of elements other than tungsten. In some embodiments, tungsten portions described herein consist essentially of tungsten. Analogous definitions apply to all materials described herein.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated, and/or ionized states. A "radical precursor" is used to describe plasma effluents (a gas in an excited state which is exiting a plasma) which participate in a reaction to either remove material from or deposit material on a surface. "Radical-fluorine precursors" describe radical precursors which contain fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a various ancillary processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

While the foregoing is directed to embodiments of the present disclosure, other and further embodiments of the disclosure may be devised without departing from the basic scope thereof, and the scope thereof is determined by the claims that follow.

What is claimed is:

1. A method of etching a substrate, comprising:
   positioning a substrate in a processing chamber, wherein the substrate has a first exposed portion comprising silicon and a second exposed portion comprising at least one material other than silicon;
   introducing a fluorine-containing precursor into a remote plasma region of the processing chamber;
   applying RF power to generate plasma effluents in the remote plasma region;
   introducing a hydrogen-containing precursor into a substrate processing region through first showerhead channels bypassing the remote plasma region, wherein an atomic flow ratio of hydrogen (H) to fluorine (F) is between about 4:3 and about less than 10:1; and
   flowing the plasma effluents from the remote plasma region through second showerhead channels to the substrate processing region of the processing chamber, wherein the plasma effluents etch the first exposed portion at a rate greater than an etch rate of the second exposed portion.

2. The method of claim 1, wherein the first exposed portion is polysilicon.

3. The method of claim 1, wherein the second exposed portion is silicon oxide, silicon nitride, and/or a metallic material.

4. The method of claim 1, wherein the hydrogen-containing precursor is hydrogen ($H_2$).

5. The method of claim 1, wherein the nitrogen-containing precursor is selected from the group consisting of atomic fluorine, diatomic fluorine, nitrogen trifluoride, carbon tetrafluoride, hydrogen fluoride, and xenon fluoride.

6. The method of claim 1, wherein the substrate processing region is plasma free during etching of the first exposed portion.

7. The method of claim 1, wherein an etch selectivity of the first exposed portion to the second exposed portion is greater than about 100:1.

8. The method of claim 1, wherein an electron temperature within the substrate processing region is below about 0.5 eV during etching of the first exposed portion.

9. A method of etching a substrate, comprising:
   positioning a substrate in a processing chamber, wherein the substrate has an exposed polysilicon portion and an exposed silicon nitride portion;
   introducing a fluorine-containing precursor into a remote plasma region of the processing chamber;
   applying RF power to generate plasma effluents in the remote plasma region;
   introducing a hydrogen-containing precursor into a substrate processing region through first showerhead channels bypassing the remote plasma region, wherein an atomic flow ratio of hydrogen (H) to fluorine (F) is between about 4:3 and less than 10:1; and
   flowing the plasma effluents from the remote plasma region through second showerhead channels to the substrate processing region of the processing chamber, wherein the plasma effluents etch the exposed polysilicon portion at a rate greater than an etch rate of the exposed silicon nitride portion.

10. The method of claim 9, wherein the hydrogen-containing precursor is hydrogen ($H_2$).

11. The method of claim 9, wherein the nitrogen-containing precursor is selected from the group consisting of atomic fluorine, diatomic fluorine, nitrogen trifluoride, carbon tetrafluoride, hydrogen fluoride, and xenon fluoride.

12. The method of claim 9, wherein the substrate processing region is plasma free during etching of the exposed polysilicon portion.

13. The method of claim 9, wherein an etch selectivity of the exposed polysilicon portion to the exposed silicon nitride portion is greater than about 100:1.

14. The method of claim 9, wherein an electron temperature within the substrate processing region is below about 0.5 eV during etching of the exposed polysilicon portion.

15. A method of etching a substrate, comprising:
   positioning a substrate in a processing chamber, wherein the substrate has an exposed polysilicon portion and an exposed silicon oxide portion;
   introducing a fluorine-containing precursor into a remote plasma region of the processing chamber;
   applying RF power to generate plasma effluents in the remote plasma region;
   introducing a hydrogen-containing precursor into a substrate processing region through first showerhead channels bypassing the remote plasma region, wherein an atomic flow ratio of hydrogen (H) to fluorine (F) is between about 4:3 and less than 10:1; and
   flowing the plasma effluents from the remote plasma region through second showerhead channels to the substrate processing region of the processing chamber, wherein the plasma effluents etch the exposed polysilicon portion at a rate greater than an etch rate of the exposed silicon oxide portion.

16. The method of claim 15, wherein the hydrogen-containing precursor is hydrogen ($H_2$).

17. The method of claim 15, wherein the nitrogen-containing precursor is selected from the group consisting of atomic fluorine, diatomic fluorine, nitrogen trifluoride, carbon tetrafluoride, hydrogen fluoride, and xenon fluoride.

18. The method of claim 15, wherein the substrate processing region is plasma free during etching of the exposed polysilicon portion.

19. The method of claim 15, wherein an etch selectivity of the exposed polysilicon portion to the exposed silicon oxide portion is greater than about 100:1.

20. The method of claim 15, wherein an electron temperature within the substrate processing region is below about 0.5 eV during etching of the exposed polysilicon portion.

* * * * *

UNITED STATES PATENT AND TRADEMARK OFFICE
CERTIFICATE OF CORRECTION

PATENT NO. : 9,564,338 B1  
APPLICATION NO. : 14/847496  
DATED : February 7, 2017  
INVENTOR(S) : Zhang et al.

Page 1 of 1

It is certified that error appears in the above-identified patent and that said Letters Patent is hereby corrected as shown below:

In the Claims

Column 14, Line 11, Claim 1, after "between" delete "about".

Signed and Sealed this  
Twenty-eighth Day of March, 2017

Michelle K. Lee  
*Director of the United States Patent and Trademark Office*